United States Patent
Wu

(10) Patent No.: US 7,646,220 B2
(45) Date of Patent: Jan. 12, 2010

(54) REDUCED VOLTAGE SUBLVDS RECEIVER

(75) Inventor: Charles Qingle Wu, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 87 days.

(21) Appl. No.: 11/904,652

(22) Filed: Sep. 27, 2007

(65) Prior Publication Data

US 2009/0086857 A1    Apr. 2, 2009

(51) Int. Cl.
*H03K 19/0175* (2006.01)
*H03K 19/094* (2006.01)
*H03K 19/082* (2006.01)

(52) U.S. Cl. .............................. 326/82; 326/80; 326/81; 326/83; 326/84; 326/85; 326/86; 326/87; 326/88; 326/89; 326/90; 326/91; 326/92

(58) Field of Classification Search ..................... 326/82
See application file for complete search history.

(56) References Cited

U.S. PATENT DOCUMENTS

| | | | |
|---|---|---|---|
| 3,845,401 A * | 10/1974 | Troiani et al. ................... | 330/2 |
| 4,977,378 A | 12/1990 | Tero | |
| 5,250,911 A | 10/1993 | Linder et al. | |
| 5,864,587 A | 1/1999 | Hunt | |
| 2001/0004219 A1 | 6/2001 | Bangs et al. | |
| 2002/0075074 A1 | 6/2002 | Wang et al. | |
| 2006/0049873 A1 | 3/2006 | Britton et al. | |
| 2006/0170449 A1* | 8/2006 | Kim et al. ..................... | 326/26 |
| 2007/0120595 A1 | 5/2007 | Udupa et al. | |

FOREIGN PATENT DOCUMENTS

| | | |
|---|---|---|
| DE | 3027071 A1 | 2/1982 |
| DE | 10154170 A1 | 6/2002 |
| EP | 0955725 A2 | 11/1999 |

(Continued)

OTHER PUBLICATIONS

Chua-Chin Wang et al., "1.0 GBPS LVDS Transceiver Design for LCD Panels", 2004 IEEE Asia-Pacific Conference on Advanced System Integrated Circuits(AP-ASIC2004)/Aug. 4-5, 2004, pp. 236-239.

(Continued)

*Primary Examiner*—Vibol Tan
*Assistant Examiner*—Matthew C Tabler
(74) *Attorney, Agent, or Firm*—Blakely Sokoloff Taylor & Zafman LLP

(57) ABSTRACT

A rail-to-rail high speed subLVDS receiver demonstrates good jitter and duty cycle performance for high-speed signals at low power supply levels. A sample receiver includes a voltage shifter for shifting the voltage levels of a differential input signal so that a shifted differential input signal is produced. The shifted differential input signal can be applied to a first differential pair, and the differential input signal can be applied to a second differential pair. The outputs of the first and second differential pairs can be summed together to produce a differential output signal. The differential output signal can be output using an output block. A clamp circuit can be used to adjust the gain of the first differential pair responsive to a common mode voltage of the first and second differential input signals.

19 Claims, 15 Drawing Sheets

FOREIGN PATENT DOCUMENTS

WO    WO 2003/061118 A    7/2003

OTHER PUBLICATIONS

"LVDS Owner's Manual", National Semiconductor, 3$^{rd}$ Edition, Spring 2004.

Carrillo, J.M. et al., "Constant GM Constant-Slew-Rate High-Bandwidth Low-Voltage Rail-to-Rail CMOS Input Stage for VLSI Cell Libraries", IEEE Journal of Solid-State Circuits, Aug. 1, 2003, pp. 1364-1372, vol. 38, No. 8, IEEE Service Center, Piscataway, NJ, ISSN: 0018-9200.

Opris, I.E. et al., "Large-signal subthreshold CMOS transconductance amplifier", Electronics Letters, Apr. 27, 1995, pp. 718-720, vol. 31, No. 9, IEE, Stevenage, GB, ISSN: 0013-5194.

PCT/US2008/076734, PCT International Search Report and Written Opinion of the International Searching Authority, mailed Jul. 6, 2009, 15 pages.

Vogel, et al., "LVDS I/O Cells with Rail-to-Rail Receiver Input for SONET/SDH at 1.25Gb/s," Fraunhofer Institute for Microelectronic Circuits and Systems, Dresden Germany, Fraunhofer Institute for Microelectronic Circuits and Systems, Duisburg, Germany Toshiba Electronics Europe, DÜsseldorf, Germany, dated prior to Sep. 27, 2007.

\* cited by examiner

REDUCED VOLTAGE SUBLVDS RECEIVER

TECHNICAL FIELD

This disclosure relates generally to drivers, and more particularly, but not exclusively, relates to low voltage differential signaling devices.

BACKGROUND INFORMATION

Relatively long signal paths are a major bottleneck in digital transmission. For example, printed circuit boards often contain circuitry that is responsible for voltage level shifting and electrostatic discharge protection on relatively long wiring paths. In addition, the circuitry often requires a relatively large amount of current to drive large resistive and capacitive loads that are presented by the relatively long wiring. Thus, the circuitry often uses large pad areas (and large passive components) and also uses a large portion of the overall power consumption. The large areas and components are often used to help dissipate the power consumed by the circuitry.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DETAILED DESCRIPTION

Embodiments of a reduced power supply differential amplifier for receiving a differential signal are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In general, various high speed differential serial link standards have been designed to accommodate increased off-chip data rate communications. High speed USB, firewire (IEEE-1394), serial ATA and SCSI are a few of the standards used for serial data transmission in the PC industry. Low voltage differential signaling (LVDS) has also been implemented in transmission-side serial data communications.

Additionally, vendors (such as cellular phone companies) have proposed a "subLVDS" standard, which is a smaller voltage-swing variant of the LVDS standard. SubLVDS has been suggested for use in the Compact Camera Port 2 (CCP2) specification for serial communications between (for example) image sensors and onboard systems.

Figure 1:
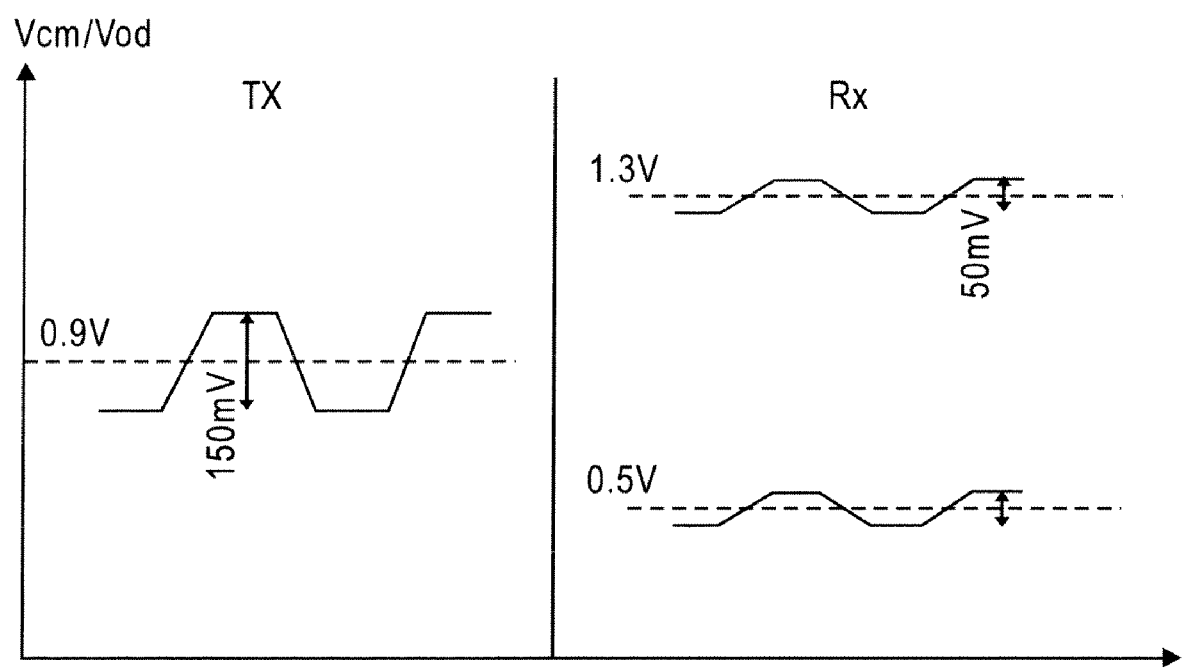
FIG. 1 is an illustration of a sample of compact camera port 2 (CCP2) line levels of transmission output signal strength and reception input signal range.

CCP2 is part of the Standard Mobile Imaging Architecture (SMIA) standard. Typical LVDS/subLVDS levels have an output common mode level (Vcm) between supply voltages VDD and VSS. For example, transmitters (Tx) for CCP2 normally have an output signal swing (Vod) of 150 mV with center voltage Vcm at 0.9 V. FIG. 1 is an illustration of a sample of CCP2 line levels of transmission output signal strength and reception input signal range.

On the receiver (Rx) side, broad accommodations are typically required for Vcm variation and smaller signals that often occur due to ground shift and backboard attenuation. The CCP2 standard specifies the receiver is to handle an input common mode voltage from 0.5V to 1.3V with an output signal swing (Vod) as small as 50 mV. Accordingly, a rail-to-rail high speed subLVDS receiver is disclosed with sufficient gain to amplify and convert, for example, a 50 mV input signal into 1.2V CMOS logic levels.

Figure 2:
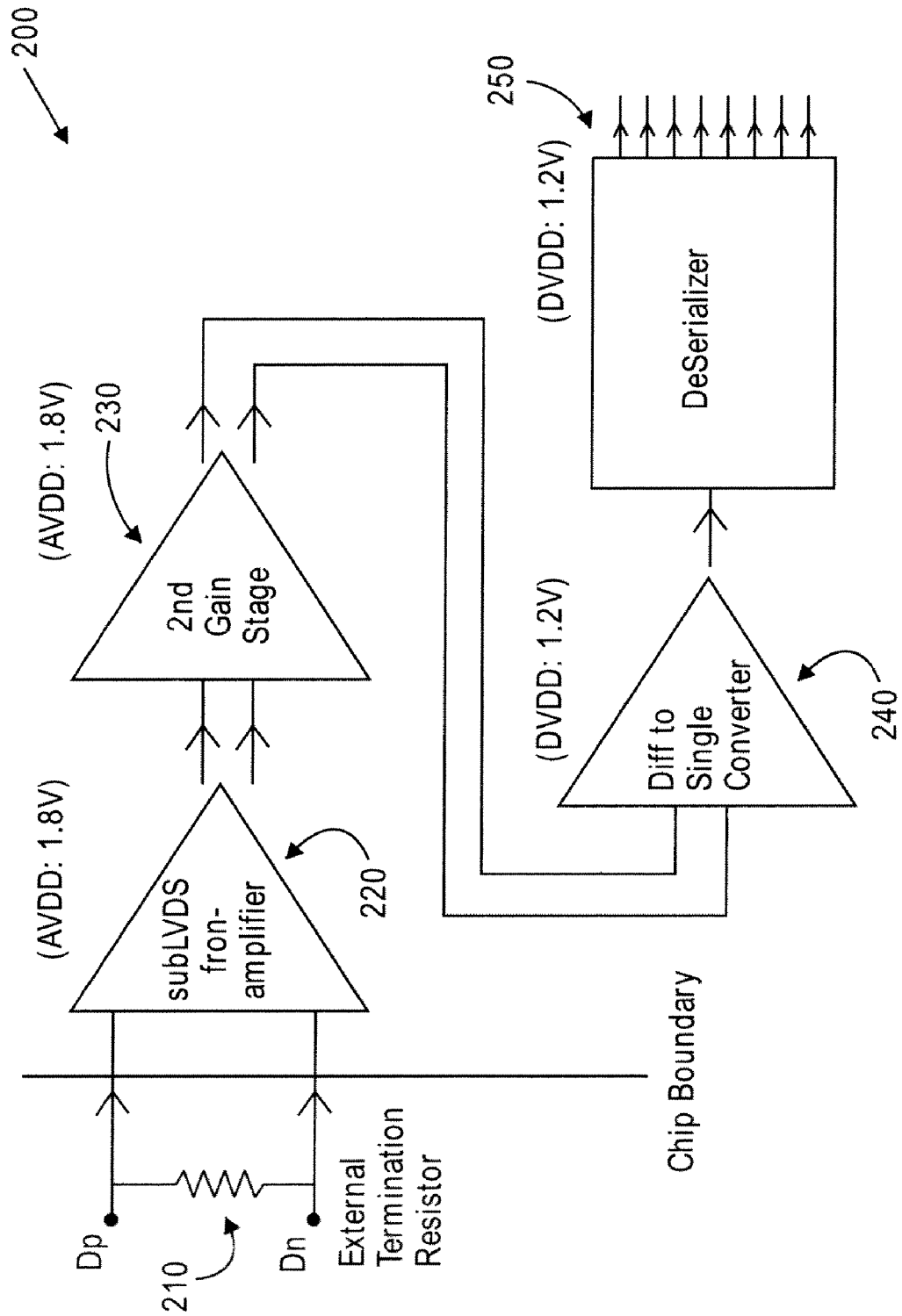
FIG. 2 is a block diagram illustrating a sample compact camera port 2 receiver.

FIG. 2 is a block diagram illustrating an example compact camera port 2 receiver. The compact camera port 2 (CCP2) receiver includes external termination resistor 210, subLVDS front-amplifier 220, secondary gain stage 230, differential-ended-to-single ended-converter 240, and de-serializer 250. As shown in FIG. 2, de-serializer 250 translates (for example) a 1.2V high speed single bit signal into 8-10-bit parallel signals (the parallel signals are normally transmitted more slowly than the serial bit stream). The parallel signals are then transferred to a successive digital logic unit for further decoding and signal processing.

To match high speed signal characteristic impedances in one example, an external termination resistor of around 100 ohms can be inserted between two on-board input nodes. For fast performance, subLVDS front-amplifier 220 and second gain stage 230 use a 1.8V supply (AVdd). A lower 1.2V power supply (DVdd) can be used with other components in order to save power.

Figure 3:
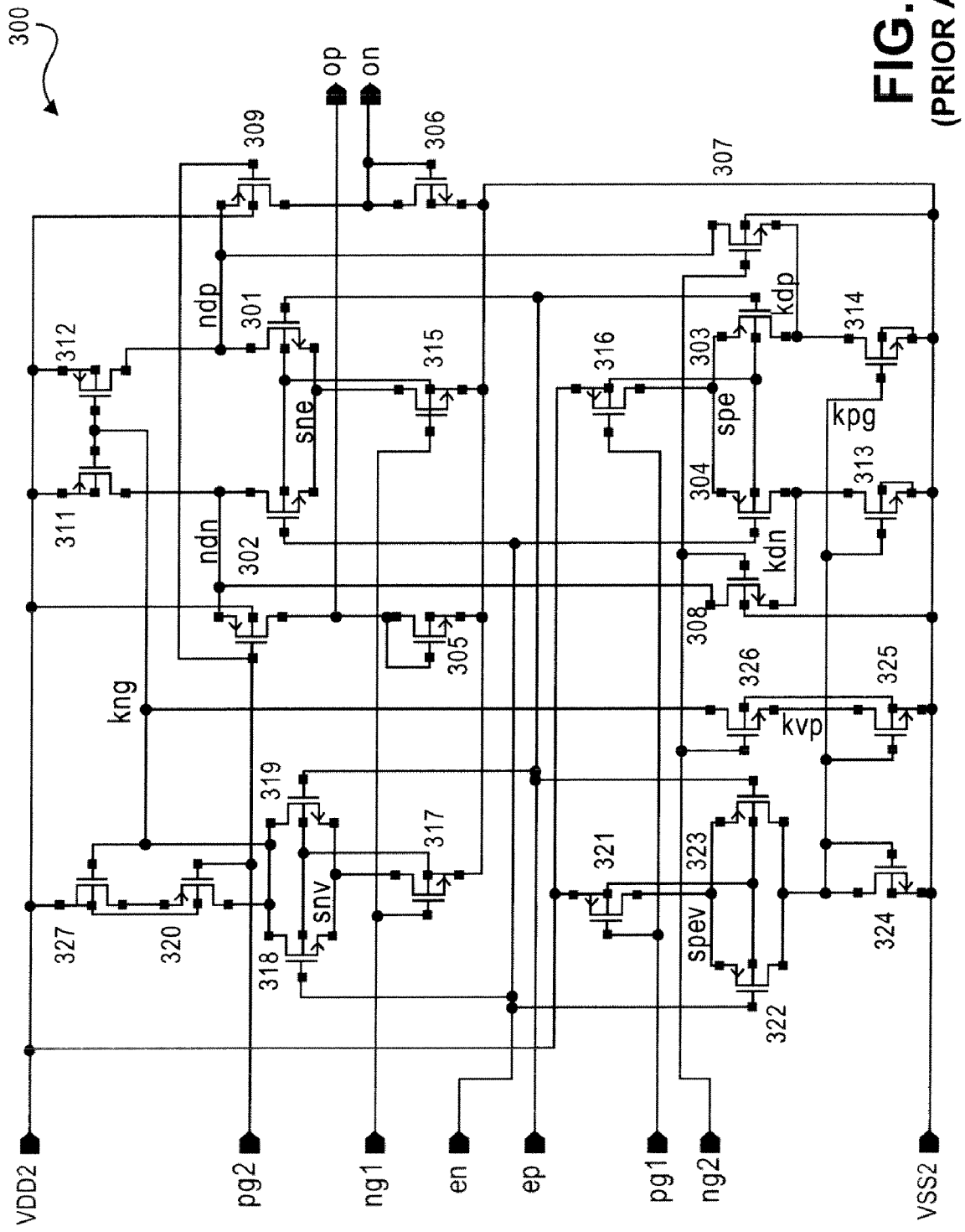
FIG. 3 is a schematic diagram illustrating a conventional rail-to-rail preamplifier.

FIG. 3 is a schematic diagram illustrating a conventional rail-to-rail preamplifier. The conventional rail-to-rail preamplifier can be used for the subLVDS front-amplifier 220, albeit with reduced performance with respect to the amplifier disclosed with respect to FIG. 4. Amplifier 300 includes MOS transistors 301-327. The inputs of NMOS 301, 302, 315 and PMOS 303, 304, 316 transistors are connected to input nodes "ep" and "en" directly. Configured as a conventional transconductance device, the output currents of the NMOS 310, 302, 315 and PMOS 303, 304, 316 transistors are injected into common diode load transistors 305 and 306.

The current control circuits of transistors 317, 318, 319, and 320, and transistors 321, 322, 323, and 324 adjust the currents of the loading sources of transistors 311-312 and 313-314 for the input stages. As configured, about half of the current normally flows through the differential transistors (301-304), with the remainder flowing through the load transistors (315-316).

The amplifier can work using rail-to-rail input voltage levels in three different operating conditions. In a first operating condition, where Vcm is around 0V, the PMOS amplifier (see, transistors 317-318) is operating and the NMOS amplifier (see, transistors 321-324) is normally turned off. The NMOS amplifier is turned off because both the tail current (flowing through transistor 315) and the current flowing through PMOS transistors 311-312 are reduced to around zero. In a second operating condition, where Vcm is around Vdd/2, both the PMOS and NMOS amplifiers are normally operating. In a third operating condition, where Vcm is around Vdd, the NMOS amplifier is normally operating.

However, the conventional rail-to-rail scheme (described above) usually requires a power supply voltage Vdd that is much larger than the sum of the threshold voltages for the stacked NMOS and PMOS transistors when operating in the first operating condition. For example:

$$Vdd < Vgsn + Vdsn + Vgsp + Vdsp < Vtp + Vtn + 0.5V$$

where Vtp is the threshold voltage for PMOS transistors, where Vtn is the threshold voltage for NMOS transistors, and where Vgsn+Vdsn+Vgsp+Vdsp is a Vcm that is the sum of: the gate-to-source voltage of an NMOS transistor (Vgsn), the drain-to-source voltage of an NMOS transistor (Vdsn), the gate-to-source voltage of a PMOS transistor (Vgsp), and the drain-to-source voltage of a PMOS transistor (Vdsp). Additionally, the voltage of the Vds cross current sources can be assumed to be above 0.1V and the overdrive voltage (Vgs−Vt) on differential pairs can be assumed to be above 0.15V.

Typical foundry processes often provide two types of transistors: core logic transistors (which have thinner oxide thickness for high speed operation), and I/O transistors (which have thicker oxide thickness for higher breakdown—2.5V to 3.3V—and improved ESD performance). In various examples, I/O transistors are often used for the "front" (e.g., near the input) differential pairs in the design.

Threshold voltages (Vt) are considerably increased when thicker oxides are used. Using thicker oxides results in increased voltage operating requirements (which lower available "headroom") that hinder some designs from operating at very low power supply voltages. For example, when the Vt of I/O transistor of a known process is about 0.6V for NMOS transistors and 0.65V for PMOS transistors (at slow process "corners"), the theoretically calculated minimum power supply is about 1.75V, which is higher than required lowest operating voltage of 1.62V (which is derated by 10% from a nominal 1.8V). Further, the gain is relatively small due at least in part to the poorer transconductance of PMOS-based differential pairs. The gain of the PMOS-based differential pairs has been shown to be about twofold. PMOS-based current steering normally adds extra transistor loading, which reduces the bandwidth further and provides additional sources or noise and jitter.

Figure 4:
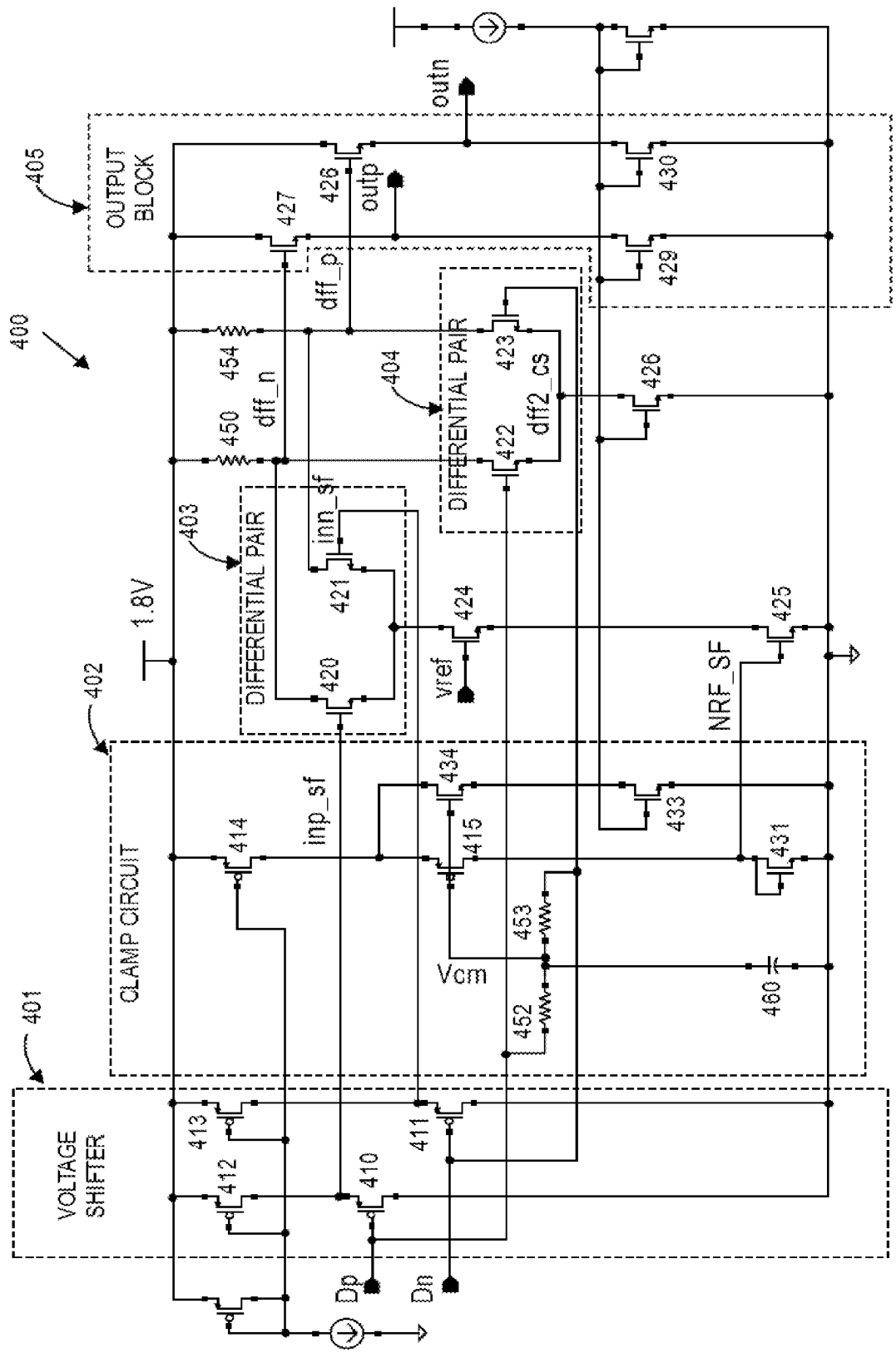
FIG. 4 is a schematic diagram illustrating a sample amplifier.

Briefly stated, an example of a rail-to-rail high speed sub-LVDS amplifier is disclosed that demonstrates good jitter and duty cycle performance for high-speed signals (such as 1 Gbs signals) at low power supply voltages (such as 1.2V). FIG. 4 is a schematic diagram illustrating a sample amplifier that can be used as a subLVDS receiver preamplifier. As shown in the depicted example, amplifier 400 includes a voltage shifter 401 for shifting the voltage levels of a differential input signal so that a shifted differential input signal is produced. The shifted differential input signal is applied to a first differential pair 403, and the differential input signal is applied to a second differential pair 404. The outputs of the first and second differential pairs are summed together to produce a differential output signal, that can be output using output block 405. A clamp circuit 402 is used to adjust the gain of the first differential pair responsive to a common mode voltage of the first and second differential input signals. (The individual components of the circuit have been grouped to facilitate discussion of the operation of the circuitry; the components can be grouped differently without affecting the operation of the circuit, for example.)

Amplifier 400 offers a lower complexity and a lowered parasitic loading (such as the parasitic loading associated with passive resistors). Amplifier 400 normally employs current mode logic (CML) that is desirable for high speed gain stages. Amplifier 400 is a "virtual" common base amplifier comprising source nodes of differential pair transistors coupled together as a virtual ground.

Voltage shifter 401 includes transistors 412, 413, 410, and 411. Transistors 410-411 are PMOS transistors arranged as source followers to raise the input level of 420-421 by the Vgs (gate-to-source voltage) of the transistors 410-411. Transistors 412-413 are also PMOS transistors arranged as source followers to help perform the voltage level shift.

Clamp circuit 402 includes transistors 414, 415, 434, 433, and 431, resistors 452 and 453, and capacitor 460. Transistor 414 provides a current that is used to control the gains of the differential pairs 403. A Vcm signal indicative of a common mode voltage of the differential signal is integrated using resistors 452 and 453, and capacitor 460. The Vcm is applied to the control terminal (e.g. gate) of transistors 415 and 434. When Vcm reaches a voltage high enough (such as a voltage greater than Vtn) to turn on differential pair 404, the gain of differential pair 403 is reduced to maintain a relatively constant transconductance and to save power. Therefore transistors 434 and 433, which mirror the tail current of differential pair 404, sink most of the current from transistor 414 and reduce the diode current on transistor 431 to close to zero. In such a way, current of transistor 425 is turned off because it is mirrored by transistor 431. Transistor 415 in the example is arranged as a cascode transistor. In addition, when Vcm is close to Vdd, transistors 412 and 413 are turned off, which substantially reduces the current in the voltage shifter 401. The reduced current in the voltage shifter 401 is mirrored by transistor 415 and 414, and turns off the channels of transistors 431 and 425, which turns off the differential pair 403 as well.

Differential pair 403 includes transistors 420 and 421 having sources coupled together to form a tail. The differential pair 403 receives a voltage shifted differential signal from voltage shifter 401 and amplifies the signal in accordance with a tail current developed through transistors 424 and 425. Differential pair 404 includes transistors 422 and 423 having sources coupled together to form a tail. Differential pair 404 receives the input differential signal and amplifies the signal in accordance with a tail current developed through transistors 426. The drains of respective differential pairs are coupled together and output voltages developed respectively across resistors 454 and 451 to produce a differential output signal.

The differential output signal can be applied to output block 405, where transistors 427 and 429 and transistors 428 and 430 are respectively arranged as source followers to buffer the applied differential output signal.

In various embodiments, transistors 422 and 423 of differential pair 404 can be, for example, I/O-type NMOS transistors with higher voltage thresholds, while transistors 420 and 421 of differential pair 403 can be, for example, core logic NMOS transistors having smaller voltage thresholds, smaller sizes and smaller Ids (current drain-to-source). For ESD and biasing purposes, I/O PMOS processing can be, for example, selected for transistors 410 and 411, which is designed to have a higher Vgs voltage drop than the sum of Vgs of transistors 420 and 421 and Vds through transistors 424 and 425.

The clamp circuit 402 is arranged in various embodiments to maintain a constant gain (or output swing), and to minimize the jitter due to propagation delay variations that, for example, result from Vcm variations. The disclosed clamping function is arranged to accommodate rail-to-rail input voltage levels for three operating modes.

For a first operating mode, the Vcm is around 0V. When Vcm is lower than, for example, Vtn, there is insufficient "headroom"(with respect to the Vds) for transistor 426 to be a current source; which reduces the tail current and reduces and/or shut down the gain of transistors 422-423. It also reduces the current source of transistor 433 to ensure the current through transistor 414 is coupled through a current mirror into transistors 424 and 425. At the same time, the source followers of voltage shifter 401 operate to shift the input signal level so that the differential pair of transistors 420-421 can be driven. Thus, amplifier 400 can maintain a relatively constant gain while transistors 420-421 are activated with current source of 424 and 425 being fully activated. Transistor 424 serves as a cascode stage for 425 to reduce the channel modulation.

For a second operating mode, the Vcm is around Vdd/2. Both differential pairs 403 and 404 are activated. However the activated current source (transistor 433) can sink a partial current of transistor 414 so that the tail current of transistor 424 and transistor 425 is less than the case where Vcm is close to 0V. Accordingly, the gain of differential pair 403 is lessened as the Vcm approaches more closely to 0V.

For a third operating mode, the Vcm is substantially higher than VtnI (for example close to Vdd), which fully turns on differential pair 404. Differential pair 403 is arranged to be turned down to maintain constant transconductance and save power. In the example, transistors 434 and 433, which mirror the tail current of differential pair 404, subtract most of the current from transistor 414, which results in a residual current on diode transistor 431 that is close to zero. In the example, differential pair 403 is turned off because the current source transistor 425 is mirrored from transistor 431. Transistor 415 serves as a cascode stage. As discussed above, when Vcm is close to Vdd, the operation of transistors 412 and 413 and voltage shifter 401 is substantially reduced. Transistors 415 and 414 mirror the reduced current from level shifter 401, which turns off diode transistor 431 and subsequently differential pair 403.

Matching of transistors can be used to minimize variations in gain and propagation delays in transistors. In various examples, transistor 434 is matched with respect to transistors 422 and 423, and transistor 433 is matched with transistor 426. Matching of transistor 415 with transistors 410 and 411 in the clamp circuit of various examples works to ensure the sums of the tail currents of transistor 424 and transistor 426 are substantially unchanged over the rail-to-rail Vcm variation. Thus, the matching of transistors works to ensure that a constant current swing through resistors 454 and 451 over Vcm is maintained. By closely matching transistors, gain variation and propagation delay (latency) variation in data transition (which is a major source of jitter) can be minimized with respect to variations in the Vcm.

Figure 5:
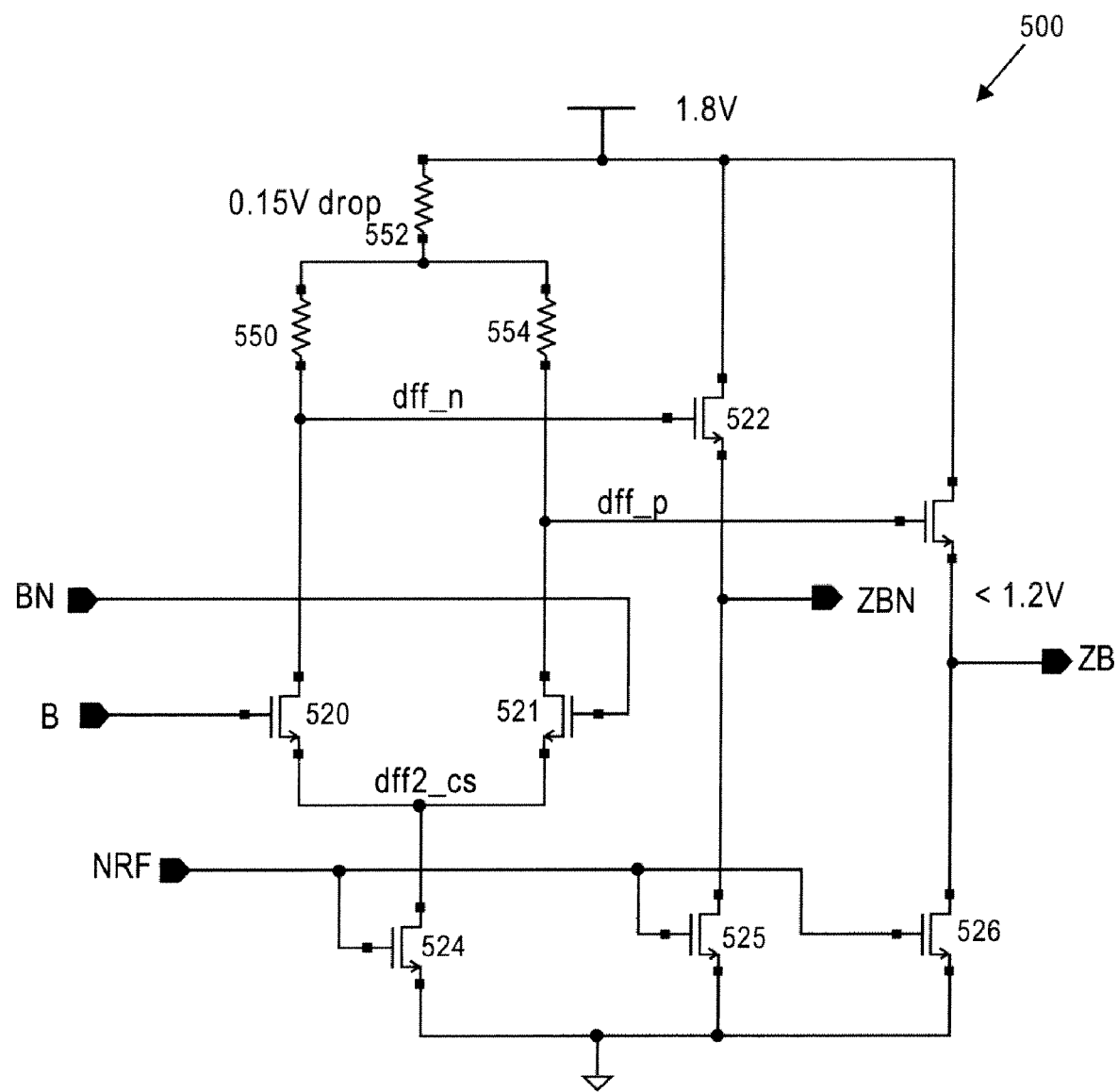
FIG. 5 is a schematic diagram illustrating a sample secondary gain stage.
Figure 6:
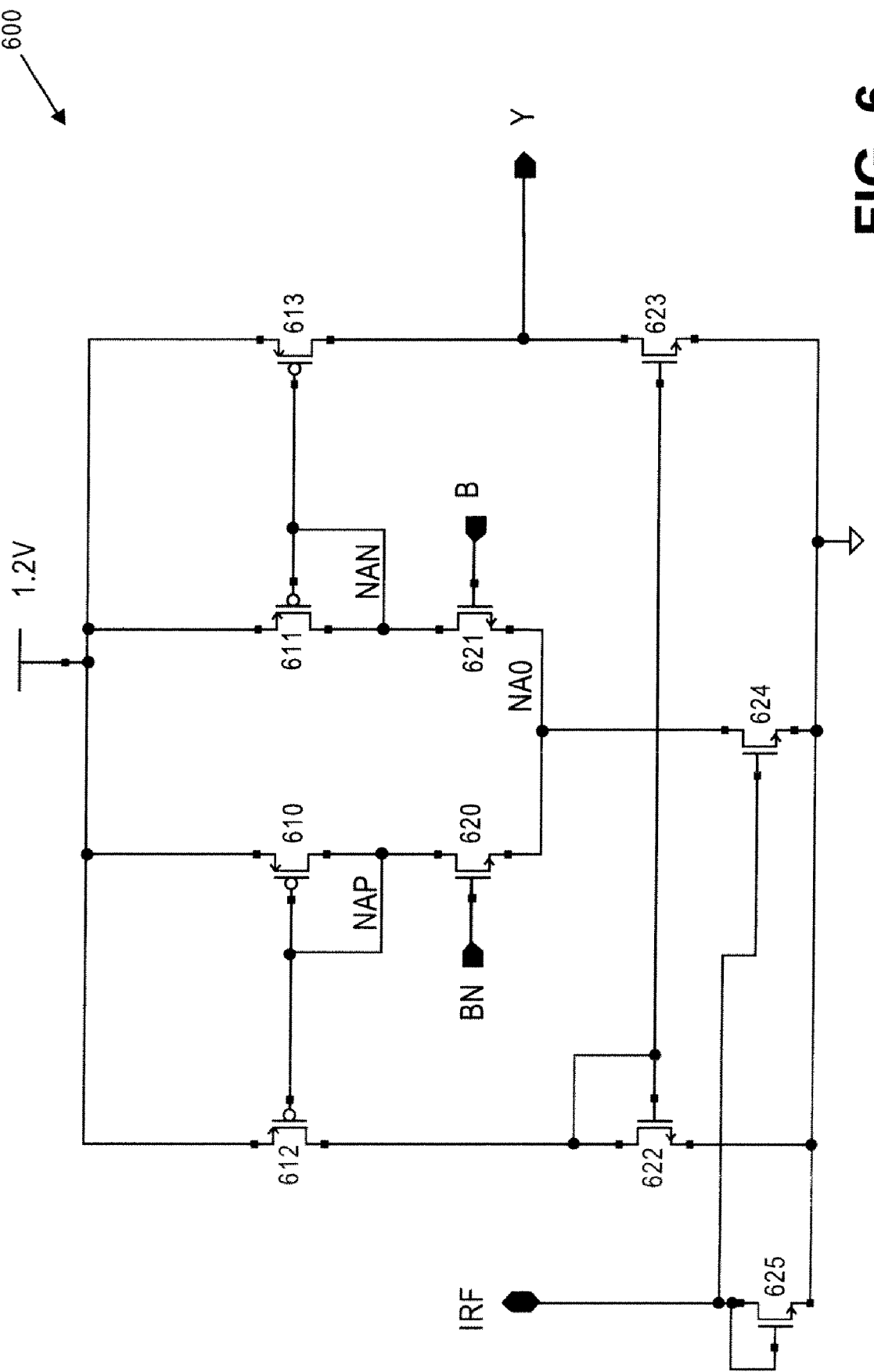
FIG. 6 is a schematic diagram illustrating a sample differential-to-single converter.

FIG. 5 is a schematic diagram illustrating a sample secondary gain stage. Secondary gain stage 500 includes resistors 550, 551, and 552, and NMOS transistors 520, 521, 522, 523, 524, 525, and 526. The input of secondary gain stage 500 can be coupled to the output of amplifier 400 to increase the overall signal gain and to shift the logic high signal from 1.8 V down to less than 1.2 V (which can save power consumed by circuitry for receiving the signal). FIG. 6 is a schematic diagram illustrating a standard differential-to-single converter. Converter 600 includes PMOS transistors 610, 611, 612, and 613, and NMOS transistors 620, 621, 622, 623, 624, and 625. Converter 600 translates small differential input signals to a single-ended signal having a voltage swing of around 0 to 1.2V.

Accordingly, the disclosed rail-to-rail amplifier/amplifier includes a voltage shifter 410 that is configured as a PMOS source follower for performing a level shift. The source follower is normally able to maintain a constant gain even when the Ids is decreased due to a channel modulation of PMOS transistors 412 and 413. Additionally, the overdrive voltage (Vgs−Vt) can be much smaller in PMOS transistors 410 and 411 than its differential gain counterparts (such as transistors 303 and 304 in FIG. 3) in conventional designs.

Additionally, the disclosed rail-to-rail amplifier/amplifier can use a power supply voltage Vdd that is smaller than the Vdd required by conventional approaches. In conventional approaches, Vdd is normally required to be greater than the sum of the threshold voltages (Vtp+Vtn) and overdrive voltages. The overdrive voltages can be 0.35V, which allows for source follower Vds cross current sources of above 0.05V, and allows for an overdrive voltage (Vgs−Vt) on transistors 410-411 above 0.05V.

In view of the above disclosure, the disclosed amplifier can provide about a 150 mV headroom advantage over conventional designs. Thus a high speed performance can be achieved for an example slow process corner with high Vt and a low power supply of 1.62V. Additionally, the disclosed amplifier gain can be higher than conventional approaches. Passive resistors used in the example typically have less parasitic capacitance and noise. The gain blocks of the disclosed amplifier are typically based on NMOS technology, which has normally higher transconductance than PMOS devices having the same sizes.

Figure 7:
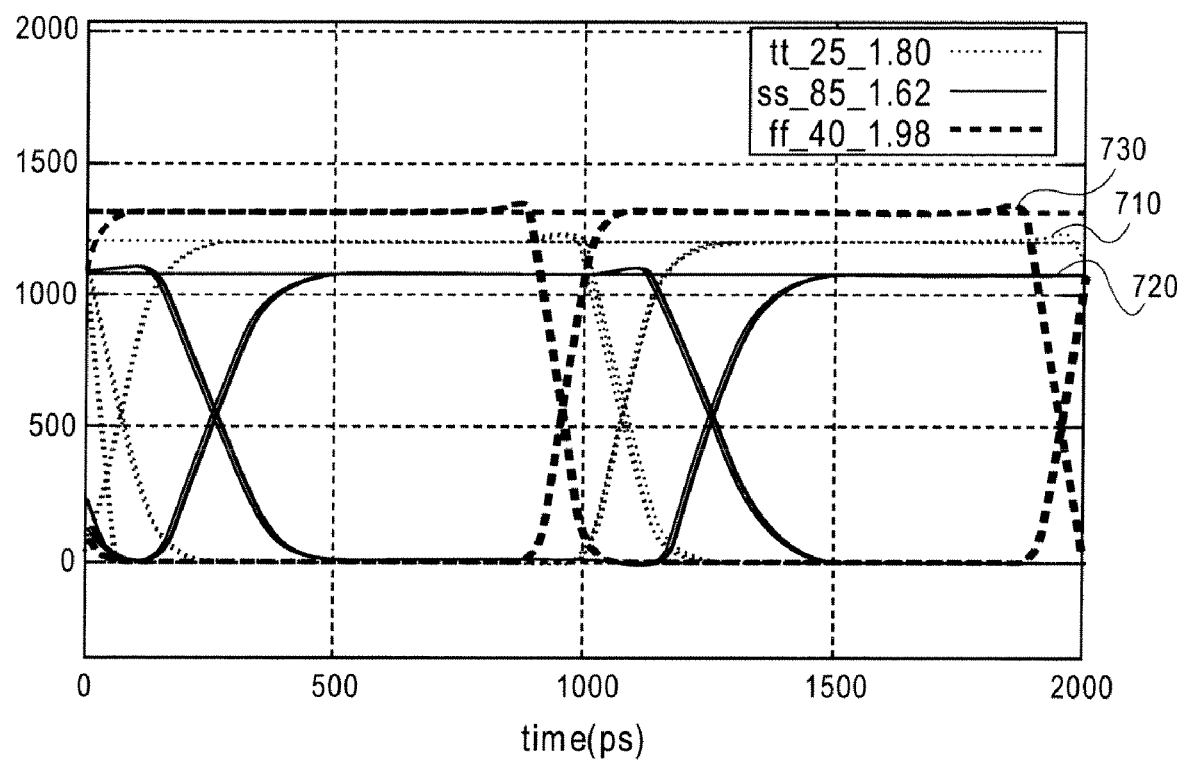
FIG. 7 is a waveform diagram illustrating a sample time domain simulation of 1 Gbs signal at the output node of differential-to-single ended converter.

Simulations using various example process, power supply (1.8V±10%) and temperature (−40 C to 85 C) PVT corner simulations have been performed. Process corners include slow, typical and fast corners of transistors. FIG. 7 is a waveform diagram illustrating a sample time domain simulation of 1 Gbs signal at the output node. The example simulation was conducted using a pseudo-random binary sequence (PRBS).

Three traces from three representative PVT corners are shown in the Figure, where Vcm=0.9V and Vod=50mV. Trace 710 represents simulation results from a simulation using a PVT corner having an AVdd ("analog Vdd") of 1.80V and a DVdd ("digital Vdd") of 1.2V. Trace 720 represents simulation results from a simulation using a PVT corner having a AVdd of 1.68V and a DVdd of 1.08V. Trace 730 represents simulation results from a simulation using a PVT corner having a Vdd of 1.98V and DVdd of 1.32V.

Peak to peak jitter (which is defined as variation of propagation delay over various data sequences) can be caused in large part by the data pattern-induced inter-symbol interference and common mode noise. Over the corners, the output signal demonstrates fast rise and fall times (<120 picoseconds) and having a very low peak-to-peak jitter (<10 picoseconds) with which to pass 1 Gbs data. The jitter measured in the simulation is typically smaller than the around 30 picosecond jitter shown in simulations of conventional circuits.

Figure 8:
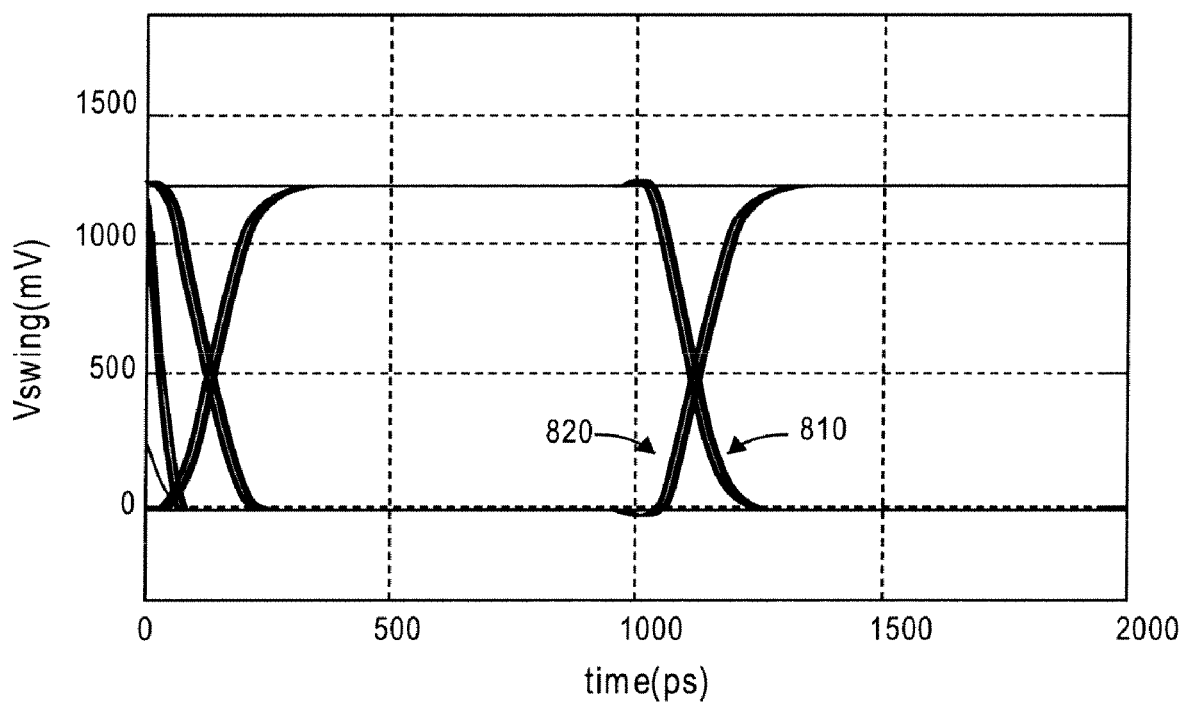
FIG. 8 is a waveform diagram illustrating a sample time domain simulation containing overlapped eye diagrams.

FIG. 8 is a waveform diagram illustrating a sample time domain simulation containing overlapped "eye" diagrams. Traces 810 and 820 represent simulation results of Vcm ranging from 0V to 1.8V. The overlapped peak-to-peak jitter in the simulation is measured to be about 26 picoseconds, which is substantially smaller than reported values (such as 97 picoseconds of jitter).

Figure 9:
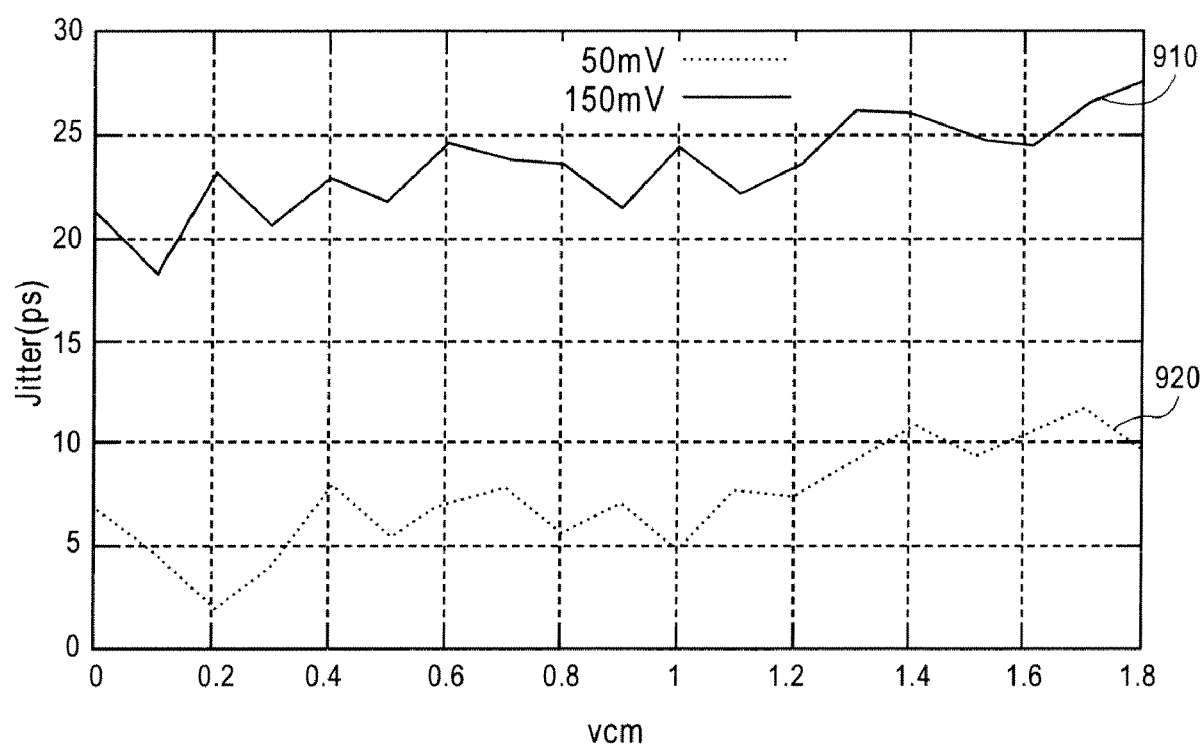
FIG. 9 is a waveform diagram illustrating a sample time domain simulation of the jitter over rail-to-rail common mode levels with various input signal strengths.

FIG. 9 is a waveform diagram illustrating a sample time domain simulation of the jitter over rail-to-rail common mode levels with various input signal strengths. Trace 910 illustrates an example simulation using a Vcm of 150 mV. Trace 920 illustrates an example simulation using a Vcm of 50 mV. Accordingly, trace 910 shows a slightly larger jitter that is generated due to the "overshoot" of the gain stages when the differential input signal has a Vcm of 150 mV.

Figure 10:
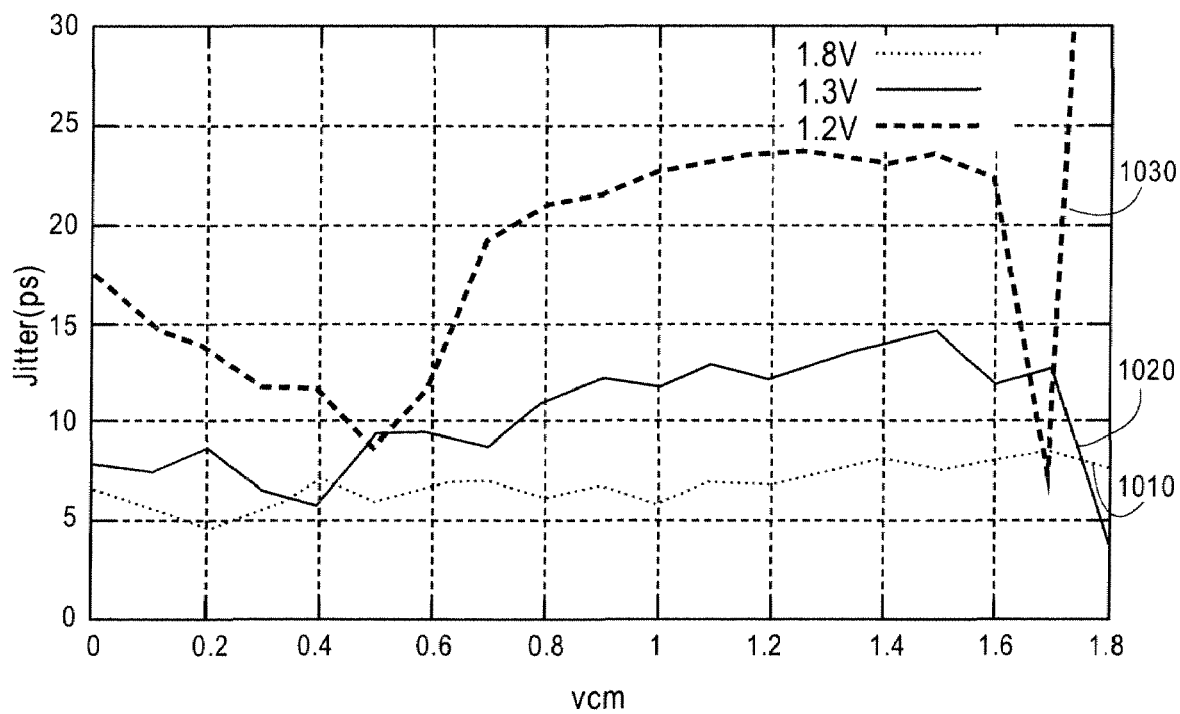
FIG. 10 is a waveform diagram illustrating a sample time domain simulation jitter over rail-to-rail common mode levels with various power supply voltages.

FIG. 10 is a waveform diagram illustrating sample time domain simulation jitter over rail-to-rail common mode levels with various power supply voltages. Trace 1010 is the peak-to-peak jitter resulting at operation at 1.8V. Trace 1020 is the peak-to-peak jitter resulting at operation at 1.3V. Trace 1030 is the peak-to-peak jitter resulting at operation at 1.2V. Trace 1030 shows that a larger jitter results when operating at 1.2V of AVdd, whereas trace 1020 shows a jitter of less than 10 picoseconds across a range of common mode levels.

Figure 11:
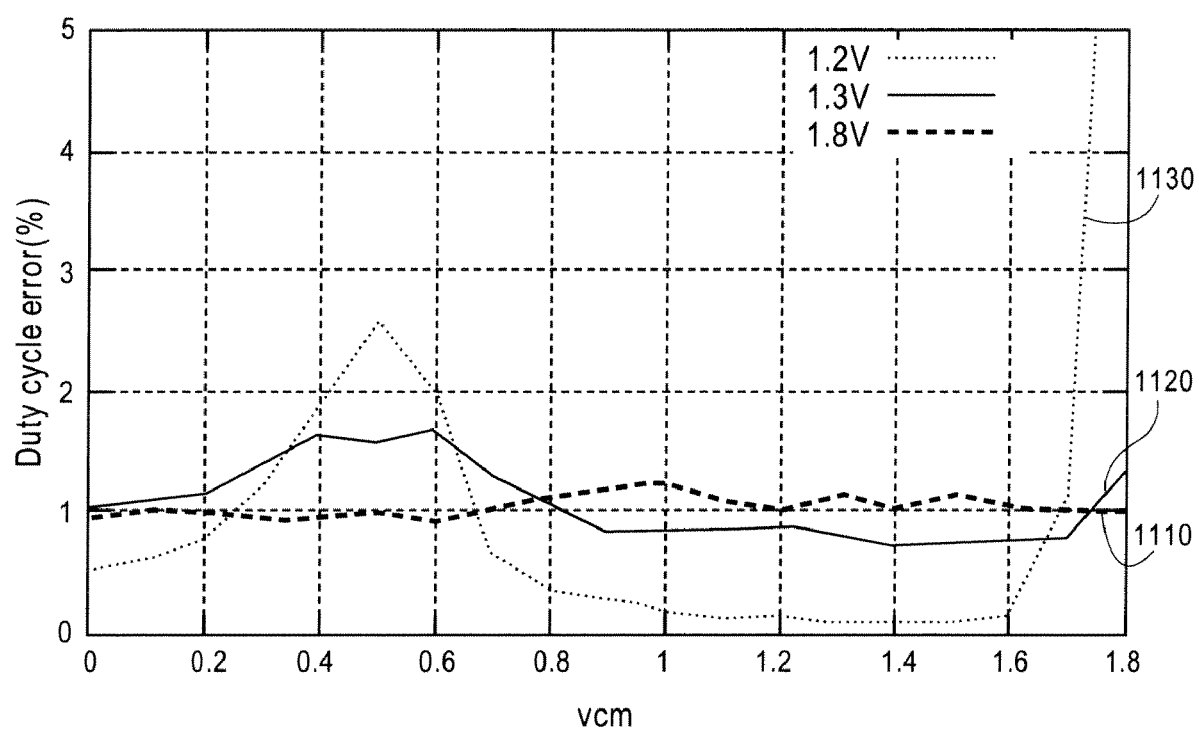
FIG. 11 is a waveform diagram illustrating a sample time domain simulation duty cycle variation over rail-to-rail common mode levels with various power supply voltages.

FIG. 11 is a waveform diagram illustrating sample time domain simulation duty cycle variation over rail-to-rail common mode levels with various power supply voltages. Duty cycle variation can be defined as variation as a percentage of the duration of logic high of a pulse over the period of the pulse. Trace 1110 is the peak-to-peak duty cycle variation resulting at operation at 1.8V. Trace 1120 is the peak-to-peak duty cycle variation resulting at operation at 1.3V. Trace 1130 is the peak-to-peak duty cycle variation resulting at operation at 1.2V.

Various embodiments of the disclosed amplifier can be practiced. For example, transistor 424 in FIG. 4 can be deleted if channel modulation of 425 is not a concern. In more examples, the common voltage mode node Vcom can also be used to clamp the current source 426 as well.

Figure 12:
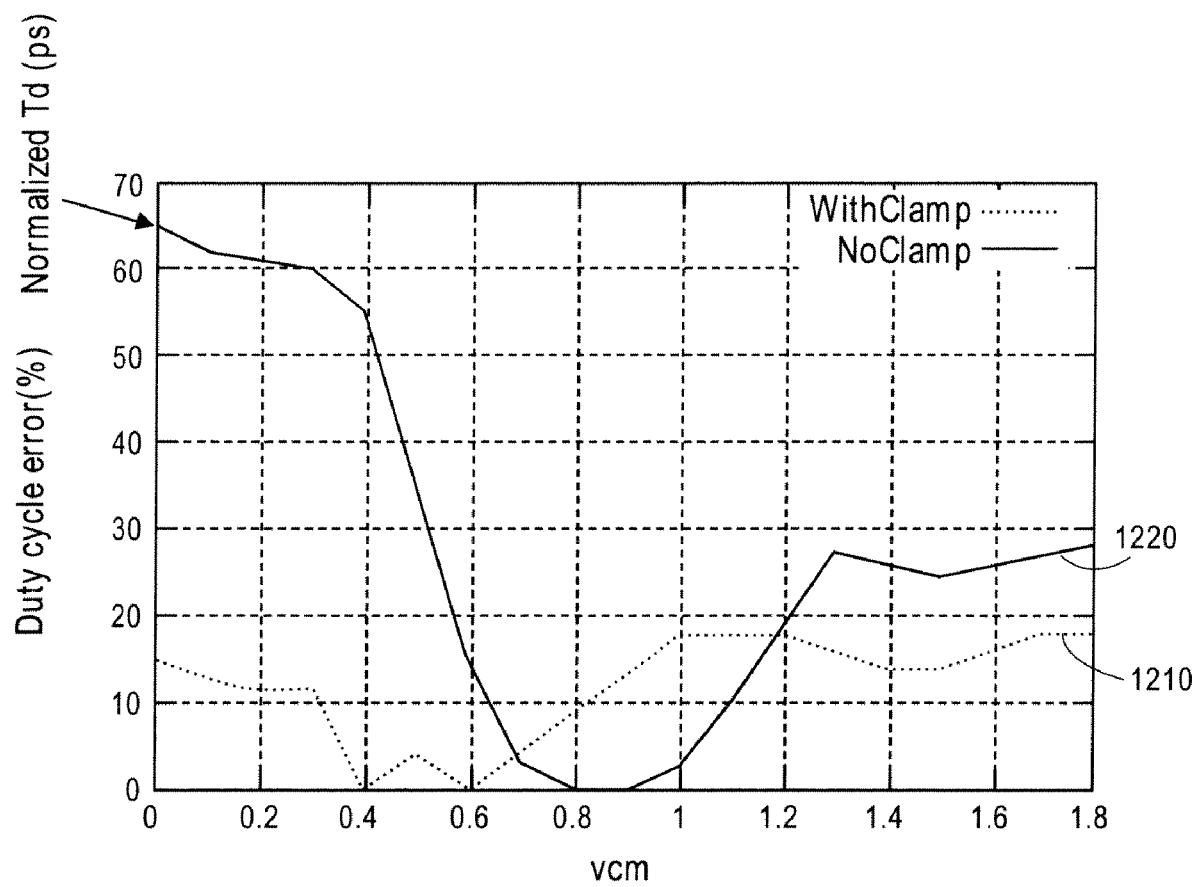
FIG. 12 is a waveform diagram illustrating effects of a sample Vcm clamp circuit of propagation delay variations at a first rise in signal transition.

FIG. 12 is a waveform diagram illustrating sample effects of a Vcm clamp circuit of propagation delay variations at a first rise in signal transition. Traces 1210 and 1220 demonstrate the disclosed amplifier performs substantially well (with a normalized first transition rise time of less than 20 picoseconds over rail-to-rail input Vcm variations) by clamping the Vcm. Trace 1220 however shows that the lack of a Vcm clamping circuit shows an increase in propagation delay variations of as much as three times over when the first logic "0" to "1" transition is encountered (over rail-to-rail Vcm).

Figure 13:
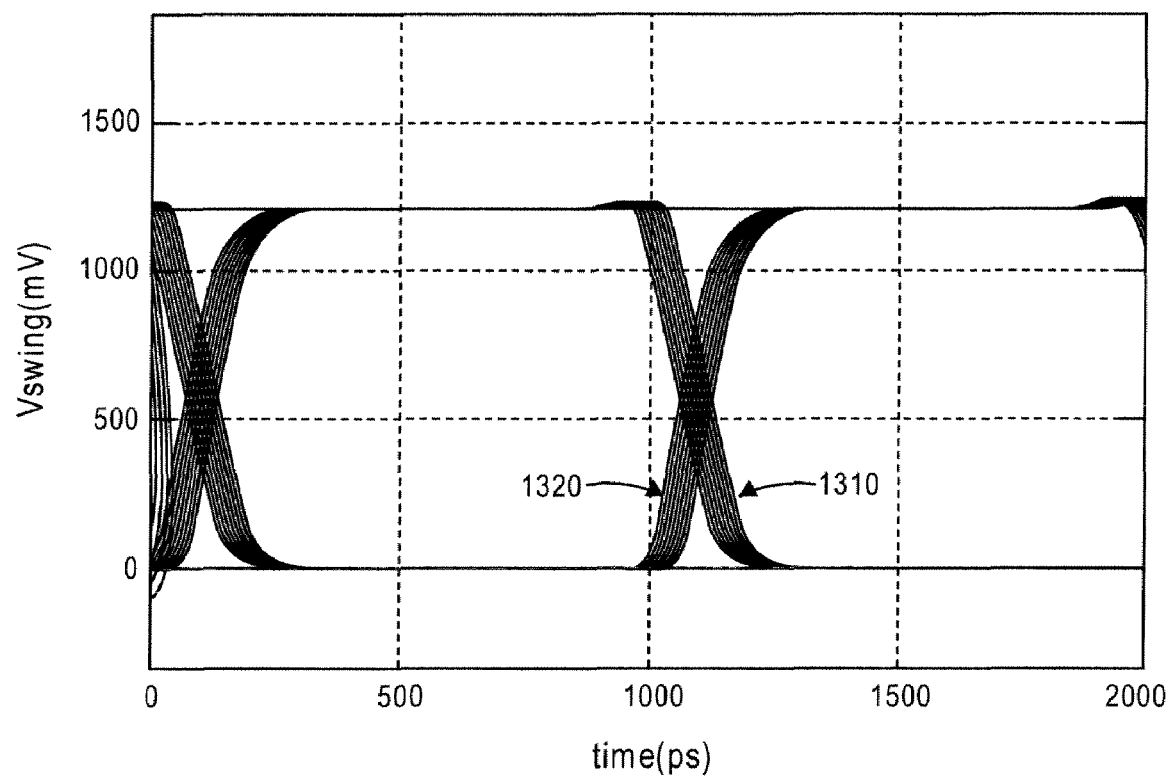
FIG. 13 is a waveform diagram illustrating a sample time domain simulation containing overlapped eye diagrams of a receiver without a clamp circuit.

FIG. 13 is a waveform diagram illustrating a sample time domain simulation containing overlapped eye diagrams of a amplifier without a clamp circuit. Traces 1310 and 1320 illustrate simulation results where the Vcm ranges from 0V to 1.8V. As compared to traces 810 and 820 in FIG. 8 above, the width of the traces 1310 and 1320 (which is a composite of results from simulations where the Vcm varies from rail-to-rail) is substantially wider, which demonstrates greater jittering when the clamping circuit is not used.

Figure 14:
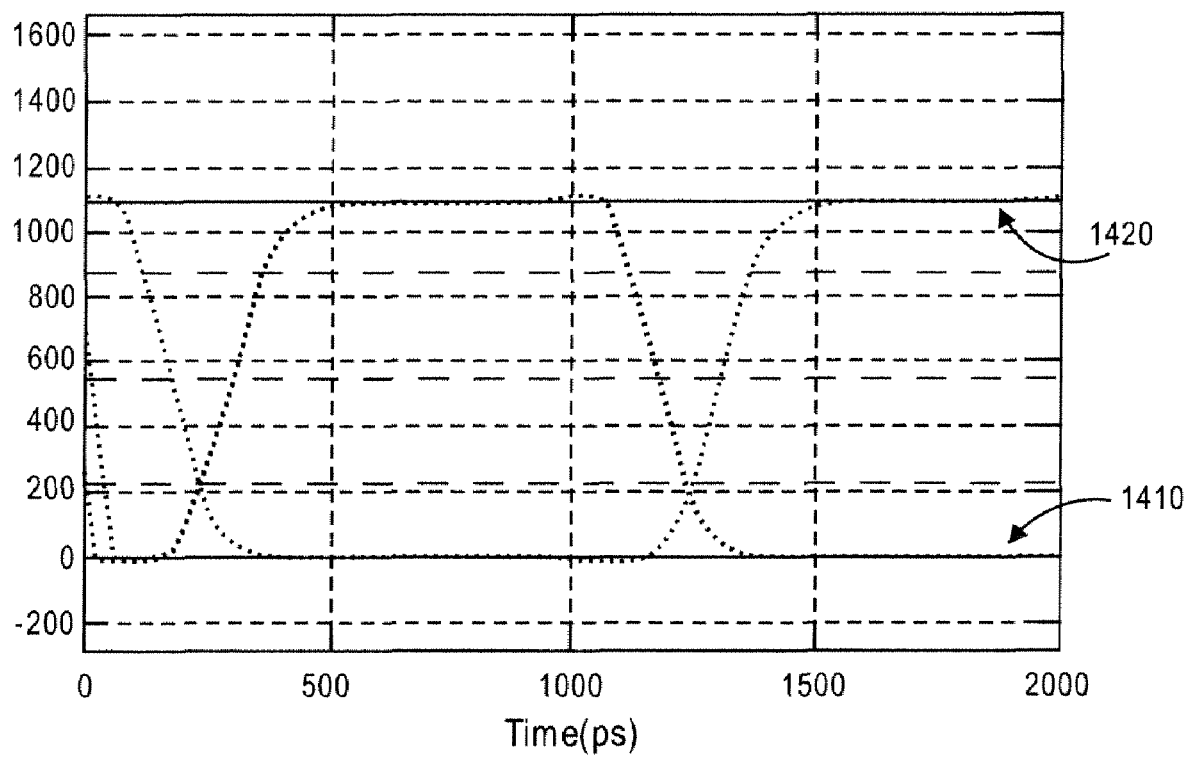
FIG. 14 is a waveform diagram illustrating a sample time domain simulation containing an output eye diagram of a receiver without a Vcm clamp using an "fs" process.

Moreover, duty cycle performance without the clamp circuit is particularly degraded at particular "PVT corners" in the processes selected to embody the circuit in an integrated circuit. FIG. 14 is a waveform diagram illustrating an example time domain simulation containing an output eye diagram of a amplifier without a Vcm clamp using an "fs" process. Traces 1420 and 1410, for example, illustrate at an "fs" corner (faster NMOS and slower PMOS), an overdrive voltage of 50 mV, a 1.62V power supply, and an operating temperature of 85° C. (or when input signal is too large), the disclosed amplifier without a VCM clamp can produce an output with a substantial duty cycle error (as shown by the asymmetry of the inverted waveforms of FIG. 14).

Figure 15:
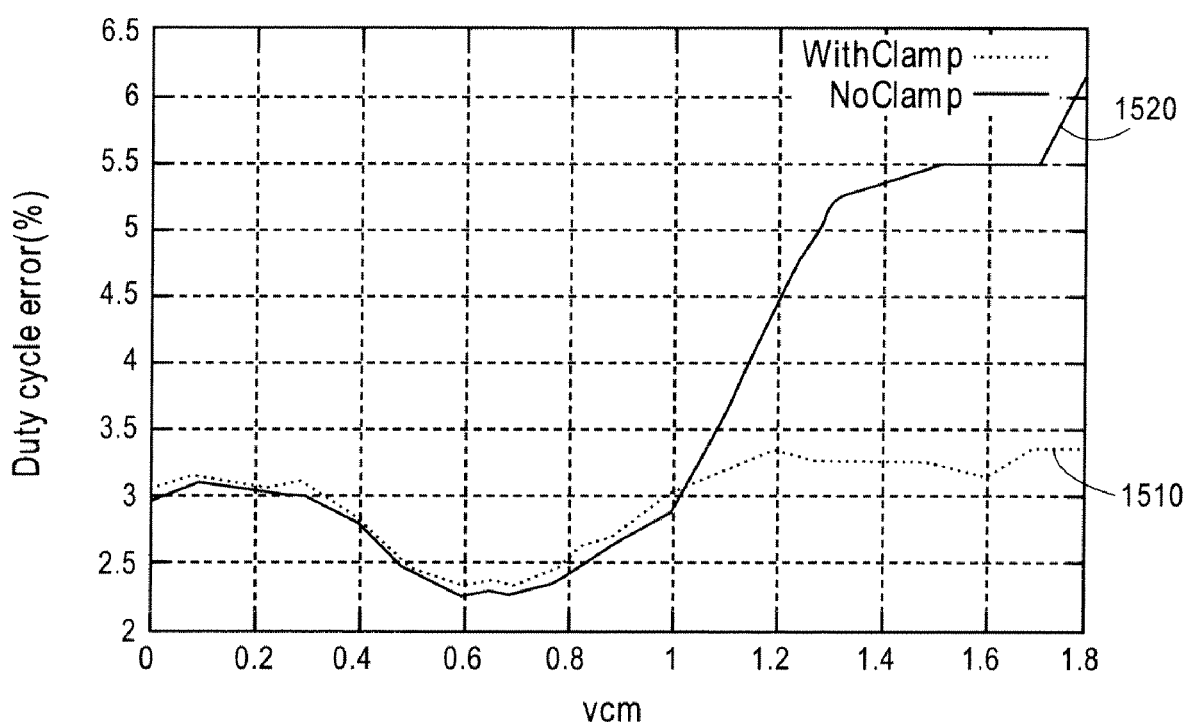
FIG. 15 is a waveform diagram illustrating a sample time domain simulation of a duty cycle variation comparison with or without a Vcm clamp circuit.

FIG. 15 is a waveform diagram illustrating a sample time domain simulation of a duty cycle variation comparison with or without a Vcm clamp circuit. Traces 1520 and 1510 of FIG. 15 show a twofold duty cycle error when Vcm is near 1.8V (using performance parameters of an "fs" corner, an overdrive voltage of 50 mV, a 1.62V power supply, and an operating temperature of 85° C.). When the Vcm is high enough to reduce the Vds of the current source of the source follower, transistors 412 and 413 (of FIG. 4) typically turn off the source follower. However, signals coupled via the parasitic capacitance of 412 and 413 are amplified by the active differential pair 420 and 421 when there is no clamp circuit. This parasitic "ringing" accelerates the decay of the falling edge, which adversely affects the symmetry of the duty cycle.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:
1. A differential amplifier, comprising:
a voltage shifter for shifting the voltage level of each of a first and second differential input signal to produce a first and second shifted differential input signal;
a first differential pair comprising a first transistor having a control terminal for receiving the first shifted differential input signal and comprising a second transistor having a control terminal for receiving the second shifted differential input signal, wherein the first and second transistors of the first differential pair each have a first non- control terminal that is respectively coupled to a first and second common output node;

a second differential pair comprising a first transistor having a control terminal for receiving the first differential input signal and comprising a second transistor having a control terminal for receiving the second differential input signal, wherein the first and second transistors of the second differential pair each have a first non-control terminal that is respectively coupled to the first and second common output node; and a clamp circuit that adjusts the gain of the first differential pair responsive to a common mode voltage of the first and second differential input signals (Vcm), wherein the clamp circuit includes a capacitor and a resistor divider to produce an integrated signal that is responsive to the common mode voltage of the first and second differential input signals, wherein the integrated signal is used to reduce a tail current of a first differential pair common tail as the Vcm approaches 0V.

2. The apparatus of claim 1, wherein the first and second transistors of the first differential pair each have a second non-control terminal that is respectively coupled to each other to form the first differential pair common tail.

3. The apparatus of claim 2, wherein the clamp circuit adjusts the gain of the first differential pair by controlling the tail current of the first differential pair common tail.

4. The apparatus of claim 1, wherein the first differential pair comprises N-type transistors and the second differential pair comprises N-type transistors.

5. The apparatus of claim 4, wherein the control terminals of the transistors of the first differential pair have gate oxides that are thicker than gate oxides of the control terminals of the transistors of the second differential pair.

6. The apparatus of claim 1, wherein the differential amplifier operates in a first mode when the common mode voltage of the first and second differential input signals approaches zero, and wherein in the first mode, the operation of the first differential pair is substantially reduced with respect to the second differential pair.

7. The apparatus of claim 6, wherein the differential amplifier operates in a second mode when the common mode voltage of the first and second differential input signals approaches a mid-rail level of the supply voltage, and wherein in the second mode, the operation of the first and second differential pair is substantially equal with respect to the opposing differential pair.

8. The apparatus of claim 7, wherein the differential amplifier operates in a third mode when the common mode voltage of the first and second differential input signals approaches the supply voltage rail, and wherein in the third mode, the operation of the second differential pair is substantially reduced with respect to the first differential pair.

9. The apparatus of claim 1, further comprising a second gain stage for reducing voltage levels of output signals associated with the first and second common output node from a first power supply rail to a second power supply rail that is lower than the first power supply rail.

10. A method, comprising:
receiving a differential input signal;
shifting the voltage levels of the received differential input signal to produce a shifted differential input signal;
applying the shifted differential input signal to a first differential pair;
applying the differential input signal to a second differential pair;
coupling the outputs of the first and second differential pairs to produce a differential output signal; and
adjusting the gain of the first differential pair responsive to a common mode voltage (Vcm) of the first and second differential input signals, wherein the clamp circuit includes a capacitor and a resistor divider to produce an integrated signal that is responsive to the common mode voltage of the first and second differential input signals, wherein the integrated signal is used to reduce a tail current of a first differential pair common tail as the Vcm approaches 0V.

11. The method of claim 10, further comprising:
reducing the tail current from the second differential pair when the common mode voltage of the received differential input signal approaches 0 volts.

12. The method of claim 10, further comprising:
reducing the tail current from the first differential pair when the common mode voltage of the received differential input signal approaches the Vdd of a circuit used to implement the method of claim 10.

13. A differential receiver, comprising:
a voltage level shifter for shifting the voltage levels of a differential input signal so that a shifted differential input signal is produced;
a first differential pair that receives the shifted differential input signal;
a second differential pair that receives the differential input, wherein outputs of the first and second differential pairs are coupled together to produce a differential output signal; and
a clamp circuit for adjusting the gain of the first differential pair in response to a common mode voltage (Vcm) of the first and second differential input signals, wherein the clamp circuit includes a capacitor and a resistor divider to produce an integrated signal that is responsive to the common mode voltage of the first and second differential input signals, wherein the integrated signal is used to reduce a tail current of a first differential pair common tail as the Vcm approaches 0V.

14. The receiver of claim 13, further comprising a second gain stage for reducing the voltage swing of the differential output signal.

15. The receiver of claim 13, further comprising a differential to single-ended converter.

16. The receiver of claim 13, further comprising a deserializer for converting serial data into parallel data.

17. The receiver of claim 13, wherein a substrate comprises CMOS transistors.

18. The receiver of claim 13, further comprising a current mirror for controlling the gain of the first differential pair.

19. The receiver of claim 13, wherein the gate oxide thicknesses of the first differential pair have gate oxides that are thicker than gate oxides of the transistors of the second differential pair.

* * * * *